United States Patent [19]
Chatterjee et al.

[11] Patent Number: 6,013,311
[45] Date of Patent: *Jan. 11, 2000

[54] USING MORPHOLOGICAL CHANGES TO MAKE PIEZOELECTRIC TRANSDUCERS

[75] Inventors: Dilip K. Chatterjee, Rochester; Edward P. Furlani, Lancaster; Syamal K. Ghosh, Rochester, all of N.Y.

[73] Assignee: Eastman Kodak Company, Rochester, N.Y.

[ * ] Notice: This patent is subject to a terminal disclaimer.

[21] Appl. No.: 09/093,268

[22] Filed: Jun. 8, 1998

[51] Int. Cl.[7] .................................................. B05D 5/12
[52] U.S. Cl. ........................................ 427/100; 29/25.35
[58] Field of Search ................................ 427/100, 376.2, 427/383.5, 419.3, 443.2; 29/25.35

[56] References Cited

U.S. PATENT DOCUMENTS 5,233,256  8/1993  Hayashi et al. ......................... 310/317
5,302,935  4/1994  Chatterjee et al. .

FOREIGN PATENT DOCUMENTS 239187  8/1992  Japan .
336708  11/1992  Japan .

*Primary Examiner*—Brian K. Talbot
*Attorney, Agent, or Firm*—Raymond L. Owens

[57] ABSTRACT

A method of forming a piezoelectric element which includes piezoelectric material having a variable functionally gradient d-coefficient including coating a block having a uniform concentration of piezoelectric material with a predetermined porosity by applying a first layer having piezoelectric material with a same or different chemical composition than the block onto a surface of the block and having a different porosity than the predetermined porosity which is selected so as to provide a different morphological structure than the block; applying a subsequent layer of piezoelectric material on the first layer with the same or different chemical composition of piezoelectric material than the block and having a different porosity than the previously deposited layer so as to provide a different morphological structure than the block or the previously applied layer(s); applying heat to the block and the applied layer to dry the applied layer; and then applying heat to sinter the piezoelectric block and applied layer so as to form a piezoelectric element with a functionally gradient d-coefficient.

7 Claims, 7 Drawing Sheets

USING MORPHOLOGICAL CHANGES TO MAKE PIEZOELECTRIC TRANSDUCERS

CROSS REFERENCE TO RELATED APPLICATIONS

Reference is made to commonly assigned U.S. patent application Ser. No. 09/071,485 filed May 1, 1998, pending, entitled "Controlled Composition and Crystallographic Changes in Forming Functionally Gradient Piezoelectric Transducers" by Chatterjee et al and U.S. patent application Ser. No. 09/071,486, filed May 1, 1998, entitled "Functionally Gradient Piezoelectric Transducers" by Furlani et al, the teachings of which are incorporated herein.

FIELD OF THE INVENTION

The invention relates generally to the field of piezoelectric elements which are useful in piezoelectric transducers.

BACKGROUND OF THE INVENTION

Piezoelectric transducers are used in a broad range of devices including accelerometers, microphones, resonators, voltage generators, ultrasonic welding and cleaning devices, and microstepping and micropumping devices. Conventional piezoelectric transducers comprise one or more uniformly polarized piezoelectric elements with attached surface electrodes. The three most common transducer configurations are multilayer ceramic, monomorph or bimorph, and flextensional composite transducers. To activate a transducer, a voltage is applied across its electrodes thereby creating an electric field throughout the piezoelectric elements. This field induces a change in the geometry of the piezoelectric elements resulting in elongation, contraction, or shear or combinations thereof. The distortion in each element tends to be uniform due to the fact that the piezoelectric properties of the element and the applied electric field are uniform throughout the element. The induced geometric distortion of the elements can be used to implement motion or perform work. However, a drawback of conventional piezoelectric transducers is that two or more bonded piezoelectric elements are often needed to implement a desired distortion such as bending. Moreover, when multiple bonded elements are used, stress induced in the elements due to their constrained motion can damage or fracture an element due to abrupt changes in material properties and strain at material interfaces.

SUMMARY OF THE INVENTION

It is an object of the present invention to provide an improved functionally gradient piezoelectric element which is particularly useful in piezoelectric transducers.

This object is achieved in a method of forming a piezoelectric element which includes piezoelectric material having a variable functionally gradient d-coefficient comprising coating a block having a uniform concentration of piezoelectric material with a predetermined porosity by the steps of:

(a) applying a first layer having piezoelectric material with a same or different chemical composition than the block onto a surface of the block and having a different porosity than the predetermined porosity which is selected so as to provide a different morphological structure than the block;

(b) applying a subsequent layer of piezoelectric material on the first layer with the same or different chemical composition of piezoelectric material than the block and having a different porosity than the previously deposited layer so as to provide a different morphological structure than the block or the previously applied layer(s);

(c) applying heat to the block and the applied layer to dry the applied layer; and (d) then applying heat to sinter the piezoelectric block and applied layer so as to form a piezoelectric element with a functionally gradient d-coefficient.

The present invention, which is directed at overcoming these problems, entails making functionally gradient piezoelectric materials in which the piezoelectric properties vary in a prescribed fashion throughout the material. The idea being that single functionally gradient piezoelectric elements can be used in place of multi-layered mechanically bonded composite structures. In accordance with the present invention, there is provided an improved method for making piezoelectric elements having materials with properties varying in a prescribed linear fashion throughout the piezoelectric element. Such piezoelectric element can be used to form piezoelectric transducer in which geometric distortions such as bending can be obtained in a controlled manner with a single piezoelectric element material It has been discovered that by controlling the porosity, grain size variations can be adjusted.

The present method of making functionally gradient piezoelectric elements which produce transducers that have the following advantages:

1. They enable the use of a single piezoelectric element to implement a desired geometric distortion thereby eliminating the need for multilayered or composite piezoelectric structures.
2. They eliminate the need for multiple electrodes and associated drive electronics.
3. They minimize or eliminate stress induced fracturing that occurs in multi-layered or composite piezoelectric structures.

DETAILED DESCRIPTION OF THE PREFERRED EMBODIMENTS

Figure 1:
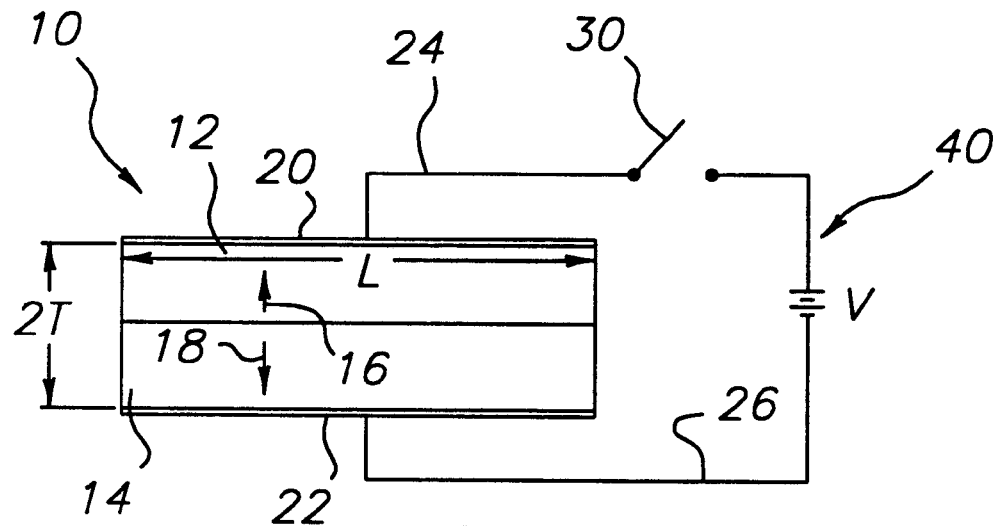
FIGS. 1 and 2 illustrate a perspective of a prior art piezoelectric bimorph transducer before and after activation, respectively.

Referring to FIG. 1, a perspectives is shown of a prior art piezoelectric transducer 10 arranged in a bimorph configuration. The bimorph transducer element comprises first and second piezoelectric plates 12 and 14 (each having width T and length L), respectively, with polarization as indicated by polarization vectors 16 and 18, respectively. The first and second piezoelectric plates 12 and 14 have attached first and second surface electrodes 20 and 22 respectively, and are bonded together with their polarization directions opposite to one another as shown. The first and second surface electrodes are connected to wires 24 and 26, respectively. The wire 24 is connected to a switch 30, which in turn is connected to a first terminal of voltage source 40. The wire 26 is connected to the second terminal of voltage source 40 as shown. In FIG. 1, the transducer 10 is shown with switch 30 open. Thus there is no voltage across the transducer 10 and it remains inactivated.

Figure 2:
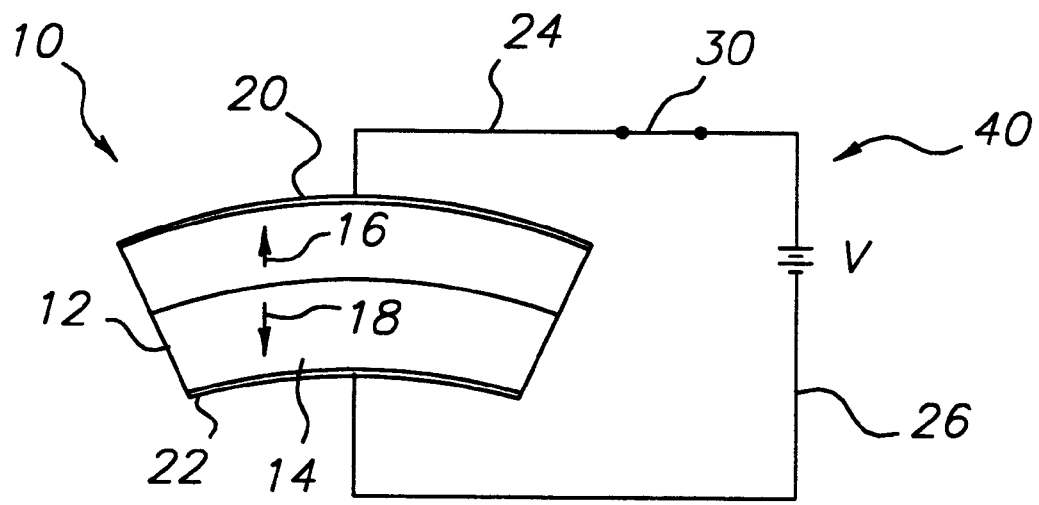

In FIG. 2, the transducer 10 is shown with switch 30 closed. In this case, the voltage V of voltage source 40 is impressed across the transducer 10 thereby creating an electric field through the body of the transducer 10 causing the first piezoelectric plate 12 to expand lengthwise and the second piezoelectric plate 14 to contract lengthwise as shown thereby causing a bending of the transducer 10 as is well known. This bending distortion can be exploited for numerous applications including vibrators, resonators, and cantilever transducers.

Figure 3A:
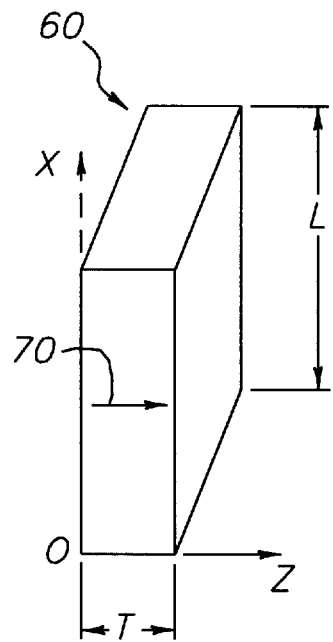
FIG. 3A illustrates a perspective view of a piezoelectric transducer element of the present invention.
Figure 3B:
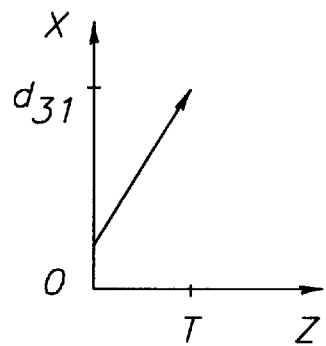
FIG. 3B show the functional dependence of the piezoelectric $d_{31}$ coefficient of a piezoelectric transducer element of the present invention.
Figure 3C:
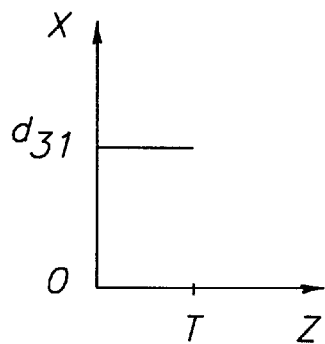
FIG. 3C shows the functional dependence of the piezoelectric $d_{31}$ coefficient of the prior art piezoelectric transducer element, respectively.

Referring to FIG. 3A, a perspective is shown of a piezoelectric element 60, made in accordance with the present invention. The piezoelectric element 60 has a width T and length L as shown and is polarized through its width as indicated by polarization vector 70. In conventional piezoelectric transducers the piezoelectric "d" coefficients are constant throughout the piezoelectric element. Moreover, the magnitude of the induced sheer and strain are proportional to these "d" coefficients. The piezoelectric element 60 is fabricated in a novel manner so that its piezoelectric properties vary in a prescribed fashion across its width as described below. Specifically the $d_{31}$ coefficient varies linearly as shown in FIG. 3B. This is in contrast to the uniform or constant spatial dependency of the $d_{31}$ coefficient in conventional prior art piezoelectric elements as shown in FIG. 3C.

Figure 4A:
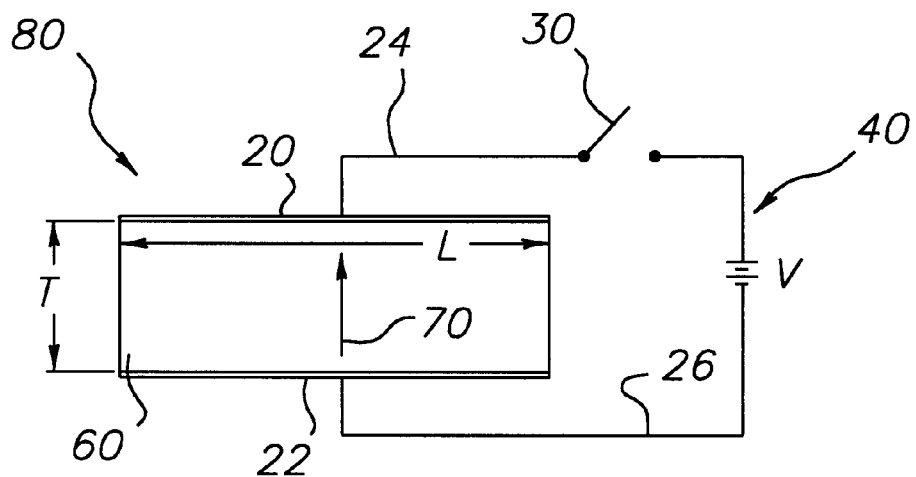
FIGS. 4A and 4B illustrate a perspective of piezoelectric transducer made from functionally gradient material of this invention, before and after transducer activation, respectively.
Figure 4B:
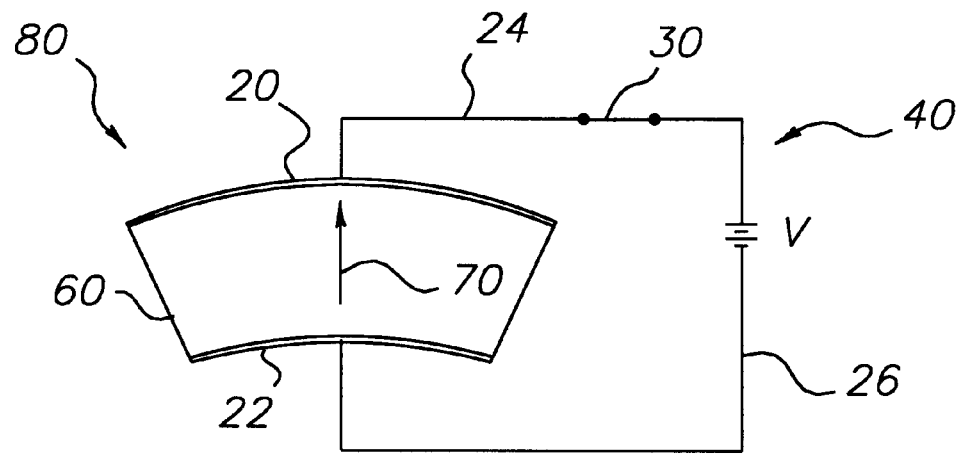

Referring now to FIGS. 4A and 4B, perspective views are shown of the piezoelectric transducer 80 made in accordance with the present invention, before and after activation, respectively. The piezoelectric transducer 80 comprises piezoelectric element 60, with polarization vector 70, and attached first and second surface electrodes 20 and 22 respectively. The first and second surface electrodes are connected to wires 24 and 26, respectively. The wire 24 is connected to a switch 30, which in turn is connected to a first terminal of voltage source 40. The wire 26 is connected to the second terminal of voltage source 40 as shown. In FIG. 4A, the transducer element 80 is shown with switch 30 open. Thus there is no voltage across the transducer 80 and it remains inactivated. In FIG. 4B, the transducer 80 is shown with switch 30 closed. In this case, the voltage V of voltage source 40 is impressed across the transducer 80 thereby creating an electric field through the piezoelectric element 60 causing it to expand length perpendicular to polarization vector 70 as is well known. Specifically, S (z) is defined to be the expansion in the x (lateral) direction noting that this expansion varies as a function of z. The thickness of the piezoelectric element is given by T as shown and therefore S $(z)=(d_{31}$ (z) V/T)×T as is well known. The functional dependence of the piezoelectric coefficient $d_{31}$ (z) increases with z as shown in FIG. 3B. Thus, the lateral expansion of piezoelectric element 60 will increase with z as shown in FIG. 4B thereby causing a bending of the piezoelectric element 60. This bending distortion can be exploited for numerous applications including vibrators, resonators, and cantilever transducers. It is important to note that this piezoelectric transducer 80 requires only one piezoelectric element as compared to two or more elements for the prior art bimorph structures as shown in FIG. 1.

The materials used in the type of devices described in this invention are functionally gradient piezoelectric materials. The present invention recognizes that such material and the present invention that led to use of such material described below. The most commonly used base materials used for such transducers as described in this invention are ceramic materials, particularly oxides with non-centrosymetric structures. It is believed that the crystal structures of these materials are not cubic or more particularly, do not possess simple symmetry. The crystal structures of these materials predominately fall into two classes: tetragonal and rhombohedral.

The materials which can be selected to have the crystal structures as described above and possess piezoelectric properties are lead titanate zirconate (PZT), lanthanum doped lead titanate zirconate (PLZT), lithium niobate ($LiNbO_3$), lithium tantalate ($LiTaO_3$), potassium niobate ($KNbO_3$), barium titanate ($BaTiO_3$) and such. All these piezoelectric materials form multi-component systems.

Continuous changes in material composition, microstructure, crystallographic structure, and porosity and so on in a multi-component system result in gradients in physical and mechanical properties. This type of material systems is termed as functionally gradient materials (FGMs). FGMs are essentially a special class of composite materials having microscopically inhomogeneous character. Continuous changes in microstructures distinguish FGMs from the conventional composite materials, in this particular case the conventional piezoelectric materials. Usually, the inorganic materials, more particularly, the ceramics, the alloys, and the metals are the materials of choice that are combined in a controlled manner either to optimize a specific property or to establish a specific profile of a property variation across the article. This feature and its inclusion in the piezoelectric materials to make an improved piezoelectric transducer.

One advantage of using functionally gradient piezoelectric materials is that the "d" coefficient of these materials can be tailor made to suite a specific application. A continuous variation of "d" coefficients in a structure is advantageous because it can exert desired amount of stress and strain in specific areas of the structure, reducing the fatigue of the material and also reducing the power requirements to drive those structures. The fatigue in the piezoelectric materials, particularly in the transducers made from such materials leads to premature fracture of the materials and catastrophic failure of the transducers.

For example, lead titanate zirconate, which has a general formula as Pb $(Ti_{1-z}Zr_z)O_3$, is usually designated as PZT. This is one of the commonly used piezoelectric materials. Among various crystallographic phases of PZT material the tetragonal and the rhombohedral phases are polarpiezoelectric. Most of the useful piezoelectric properties in this material are achieved at composition around z=0.52, where both the tetragonal and the rhombdral crystallographic phases coexist. The piezoelectric properties of PZT can be enhanced in this transition region, for the range of z between about 0.54 and 0.50, where both rhombohedral and tetragonal crystallographic forms coexist. This transition also has similar effect to the Curie transition in enhancing some aspect of piezoelectric behavior. Normally, PZT materials are prepared by mixing and ball milling of lead titanate, $PbTiO_3$ and lead zirconate; $PbZrO_3$ powders and then hot pressing the powder compacts. Functionally gradient PZT material (and also other piezoelectric materials) can be obtained by sequential dip coating and/or sequential slip casting.

Functionally gradient materials can also be made by controlled variation of its microstructures across its length or width. This variation of microstructures can either be due to the variation in its porosity and inclusion content, or due to its grain size variation. Changes in porosity will effect variations in grain size.

In this invention the method of making functionally gradient piezoelectric elements was accomplished by altering the morphological structure of the material in a gradual and controlled fashion and is taught in the following paragraph.

The introduction of imperfections, such as structural porosity, in inorganic materials cause morphological changes in the materials. It is also well known that, the piezoelectric coefficients of these materials are strongly dependent on their amount and distribution of structural porosity. The porosity distribution in these materials can be varied essentially by blending with the slurries from which the piezoelectric materials are made with either sacrificial fibers or sacrificial spheres made of polymeric materials such as polyvinyl alcohol, polyethylene glycol or acrylic. These piezoelectric elements are made by dip coating a base material or substrate in those slurries followed by drying and then sintering at a high temperature. During this sintering process the sacrificial materials burn away and leave porosity. The distribution of the sacrificial materials and nature of those sacrificial materials (such as spheres or fibers) determine distribution and the nature of those porosity (non-interconnected or interconnected). The slurries can either have same chemical composition of chemical ingredients with varying amounts of sacrificial materials or have different compositions of chemical ingredients and varying amounts of sacrificial materials. The pore size, which is primarily determined by the diameter of the sacrificial organic fibers and spheres, can vary in a range from 0.1 to 10 $\mu$m. Thus, prior to drying, the slurries or blocks will comprise composite layers containing varying degrees of the sacrificial organic fibers and spheres. Therefore, upon drying and subsequent sintering of the block, a functionally gradient piezoelectric element having a variable degree of porosity across its width will result.

Figure 5A:
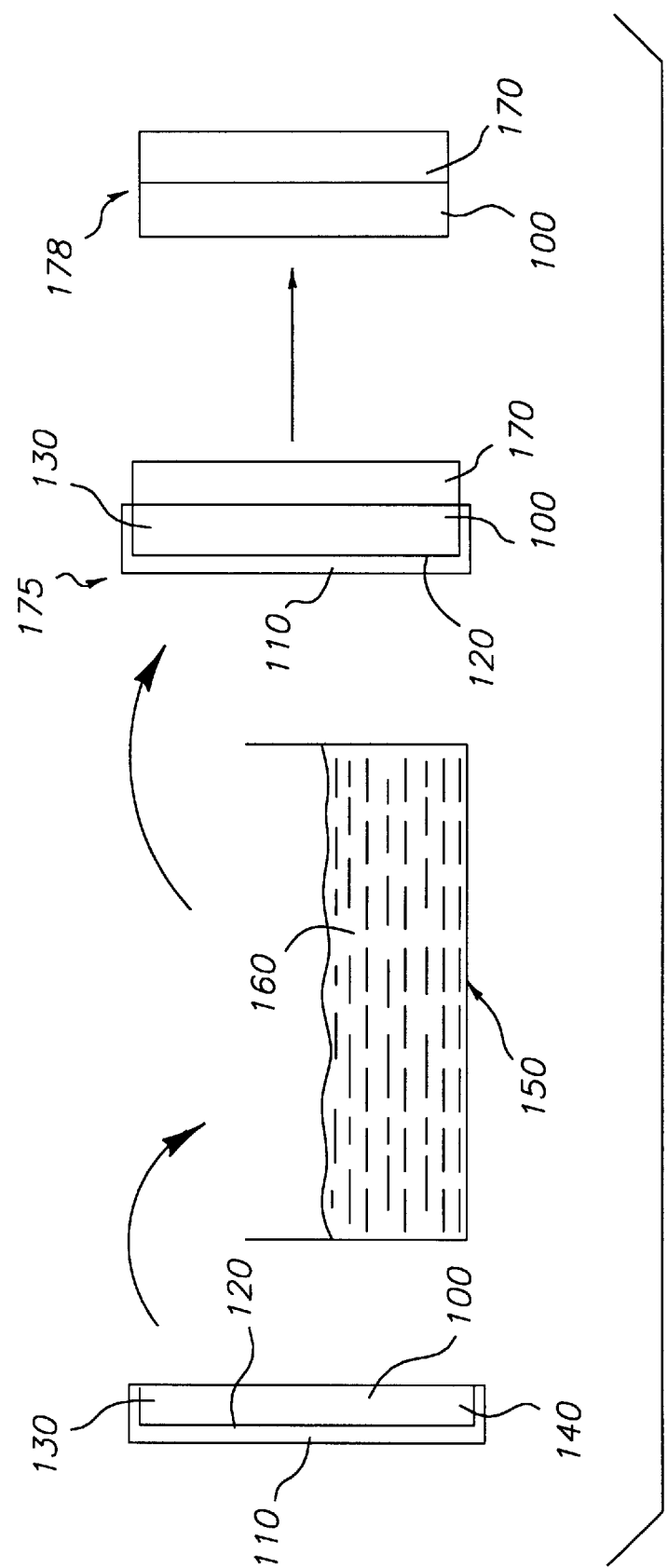
FIGS. 5A, 5B, 5C and 5D illustrate various steps in the method of making functionally gradient piezoelectric transducer elements respectively.

Referring to FIG. 5A which illustrates a way of making a functionally gradient piezoelectric element of PZT. A thin block or wafer 100 of a standard commercially available PZT material was coated with photoresist layer 110 on the one side 120 of the block. The coating of the block 100 with photoresist was done to mask the surface. The photoresist was coated on the block 100 in such a manner that the top and bottom ends 130, 140 of the block 100 were also masked. Now the photoresist-coated block was dipped in a bath 150 containing aqueous slurry 160 of lead titanate and lead zirconate, the proportion of these ingredients can either be same or different than the proportions in the block 100. Whatever is the chemical composition of the slurry, a predetermined proportion of sacrificial materials as described above is blended to the slurry. The block 100 was then removed from the bath 150 and dried at about 130° C. in an oven. This treatment causes formation of a layer 170 comprised of ingredients of the PZT material having either a different or same chemical composition that in the block 100, but in either cases it contained some predetermined proportion of sacrificial materials. This composite block 175 was stripped off of the photoresist layer 110 ether by heating at high temperature or by plasma treatment known in the art to produce a composite block 178.

Figure 5B:
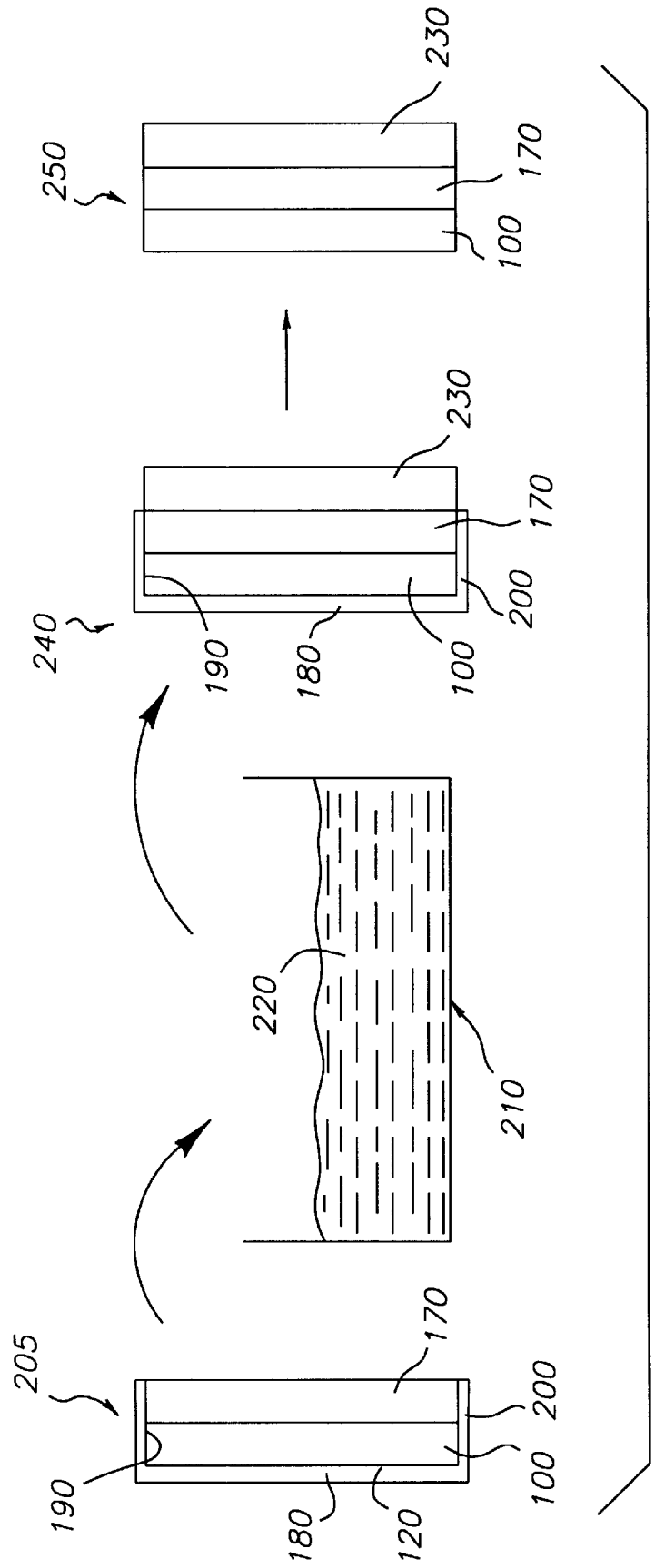

Referring now to FIG. 5B, the composite block 178 was further coated with photoresist layer 180 to block off the unexposed side 120 of the original block 100. The photoresist was coated in such a manner that it covers the top and bottom ends 190, 200 of the composite blocks 178 and the ends were masked. Now, the photoresist-coated composite block 205 was dip coated in a bath 210 having an aqueous slurry 220, which can have either the same or different proportion of lead titanate and lead zirconate compared to that in the previous bath 150. A different proportion of sacrificial materials as described above is also blended with the aqueous slurry 220. This produces an additional layer 230 on the new photoresist-coated composite block 240. The drying of the newly formed layer 230 and stripping of the photoresist layer 180 were performed following the procedures described above to produce a composite block 250. The block 250 comprised of three discrete layers 100, 170, and 230 of piezoelectric material of either the same or different chemical compositions and also having varying morphology across its width. In designing the slurries 160, 220 the proportions and nature of those sacrificial materials were chosen in such a fashion that final products could either have an interconnecting network of porosity or have isolated non-interconnected porosity or have both.

Figure 5C:
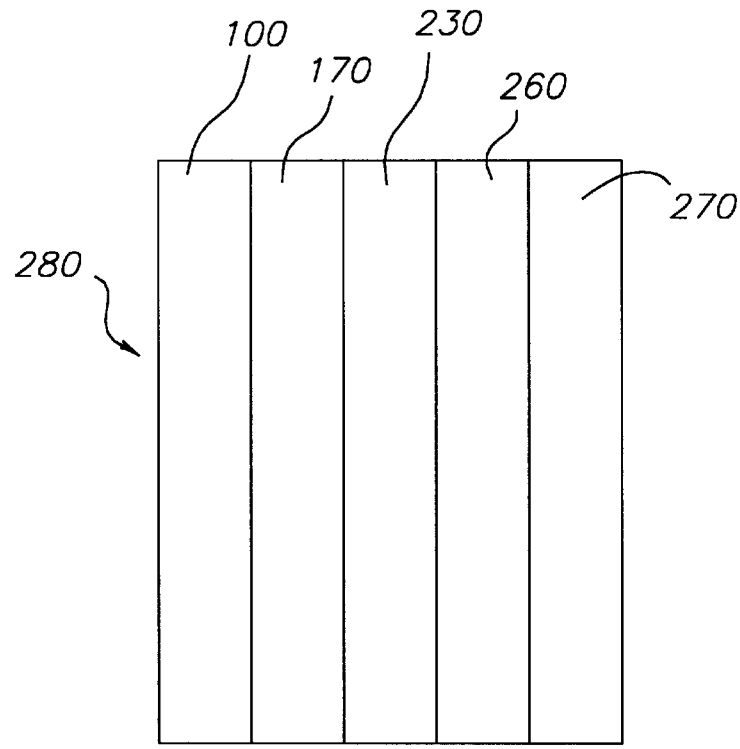

The procedure described above can be repeated a number of times to build up multiple layers of discrete piezomaterials on a block. One such block 280 is shown in FIG. 5C, which is shown as having five discrete layers 100, 170, 230, 260, and 270.

The block 280 was then sintered in a furnace in the range of at about 900° to 1300° C. and preferably at about 1100° C. for densification and more importantly effecting controlled porosity distribution with or without the composition gradient in the block. The sintering at high temperatures of the composite materials with layers having discrete compositions and porosity allows diffusion of atomic species and pores. This causes a smooth variation of composition and porosity gradient across the material resulting in a morphologically induced functionally gradient piezoelectric material. The variations in porosity across the piezoelectric material will cause variations in grain structure of the functionally gradient element. The porosity and voids and other structural defects cause enhanced diffusion of atomic species in crystalline materials, causing enhanced grain growth in the materials.

Figure 5D:
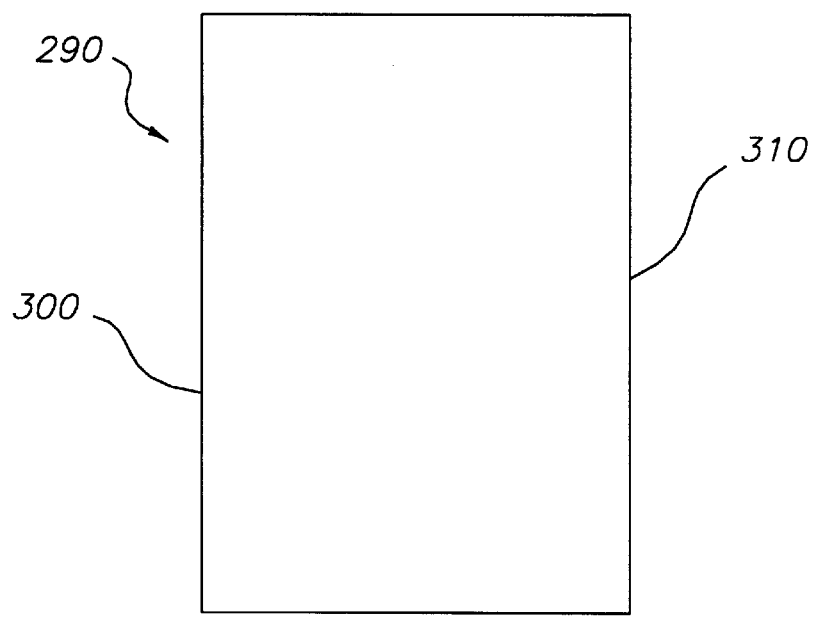

After sintering the composite block 280 it transformed to a functionally gradient piezoelectric block 290 (FIG. 5D) in which the porosity, chemical composition and also the ratios of titanium to zirconium gradually and linearly varied in the direction of width, that is from one edge 300 to the other edge 310. This functionally gradient piezoelectric material block 290 has essentially the same material as that of piezoelectric element 60 of FIG. 3A.

As discussed earlier, the functionally gradient materials can be made either by effecting a change in composition, or by change in crystal structure, or by change in morphological structure of the material from one end to the other. The foregoing embodiment of the method of manufacture of the functionally gradient piezomaterial both compositional and crystallographic changes were effected.

In an alternative embodiment of the present invention the composite layers on the block 100 can be built up by (1) tape casting and/or (2) slip casting using non aqueous slurries.

The functionally piezoelectric material block 290 was then coated with electrode materials such as silver, gold, copper, gold-palladium alloy, silver-nickel alloy and such metals and alloys known in the art. The coating was done on the surfaces 300, 310. The coating can be done by physical vapor deposition, such as sputtering, thermal evaporation, and electron beam evaporation. The spin coating of metallo-organic precursor of the electrode materials on the FGM piezomaterial and decomposing it at high temperatures is also a preferred method of forming electrodes. The electrodes on the functionally gradient piezoelectric transducers can also be constructed by screen-printing (See, for example, commonly assigned U.S. Pat. No. 5,302,935 the disclosure of which is incorporated herein) of conductive thick film inks made of gold, silver, copper, palladium, and their alloys.

Figure 6:
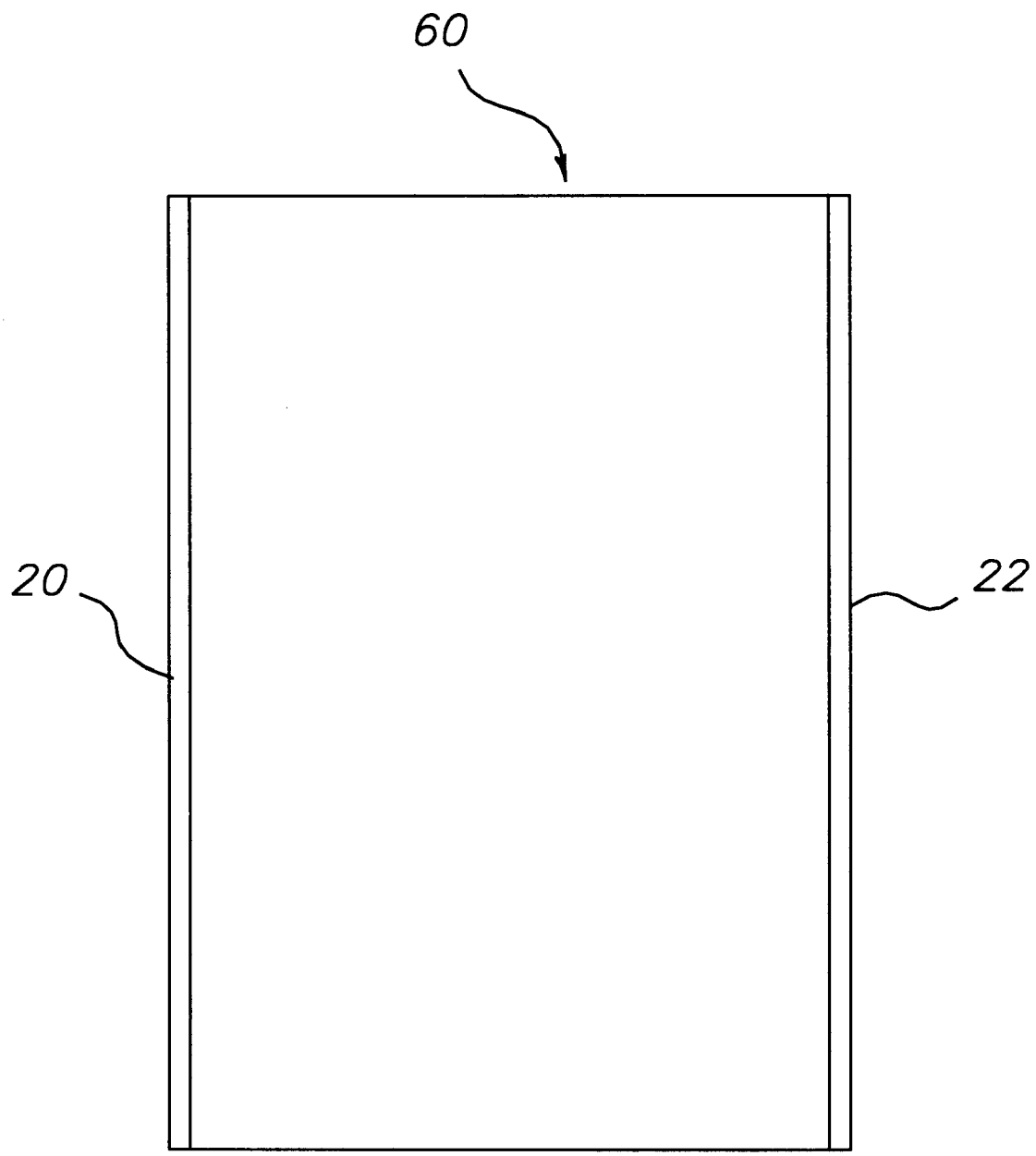
FIG. 6 shows a piezoelectric transducer having functionally gradient piezoelectric element with electrodes.

After the electrodes are applied, the functionally gradient piezoelectric element 60 is poled to align its ferroelectric domains in a well-known manner. Such poling can be accomplished by applying an external electric field or by applying an electric field through surface electrodes 20 and 22. FIG. 6 shows a functionally gradient piezoelectric transducer including first and second surface electrodes 20, 22 respectively on side faces of the piezoelectric element 60.

The invention has been described with reference to a preferred embodiment. However, it will be appreciated that variations and modifications can be effected by a person of ordinary skill in the art without departing from the scope of the invention.

PARTS LIST 10 piezoelectric transducer
12 first piezoelectric plate
14 second piezoelectric plate
16 polarization vector
18 polarization vector
20 first surface electrode
22 second surface electrode
24 wire
26 wire
30 switch
40 voltage source
60 piezoelectric element
70 polarization vector
80 piezoelectric transducer
100 thin block or wafer
110 photoresist layer
120 unexposed side of the block
121 top end of the block
140 bottom end of the block
150 first bath containing slurry
151 aqueous slurry (for first dip coating)
152 first formed material layer on wafer
153 composite block with photoresist
154 composite block without photoresist
155 photoresist layer
156 top end of the block
200 bottom end of the block
205 photoresist coated composite block
210 second bath containing slurry
220 aqueous slurry (for second dip coating)
230 second formed material layer on wafer
240 photoresist coated new composite block
250 composite block with two dip coated layers
260 discrete material layer
270 discrete material layer
280 block with discrete material layers
290 functionally gradient piezoelectric block
300 one edge of the block
310 other edge of the block

What is claimed is:

1. A method of forming a piezoelectric element which includes piezoelectric material having a variable functionally gradient $d_{31}$ coefficient comprising coating a block having a uniform concentration of piezoelectric material with a predetermined porosity by the steps of:

(a) applying a first layer having piezoelectric material with a same or different first chemical composition than the block onto a surface of the block and processing such first layer to have a different porosity than the predetermined porosity which is selected so as to provide a different morphological structure than the block, by dip coating the first layer from a bath containing an aqueous slurry of piezoelectric material of the first chemical composition;

(b) applying a second layer of piezoelectric material, by dip coating the second layer from a bath containing an aqueous slurry of piezoelectric material of the first chemical composition on the first layer with the same or different first chemical composition of piezoelectric material than the block and processing such second layer to have a different porosity than the previously deposited first layer so as to provide a different morphological structure than the block;

(c) applying heat to the block and the first and second applied layers to dry the first and second applied layers; and (d) then applying heat to sinter the piezoelectric block and first and second applied layers so as to form a piezoelectric element with a functionally gradient $d_{31}$ coefficient.

2. The method of claim 1 wherein the piezoelectric composition of the second applied layer is the same or different than the first applied layer.

3. The method of claim 1 further including the steps of applying a third layer of a piezoelectric composition having a different porosity than the previously applied first and second layers.

4. The method of claim 1 wherein the piezoelectric composition of each subsequently applied layers is the same or different than the previously applied layer.

5. The method of claim 1 wherein the block includes materials selected from the group consisting of PZT, PLZT, $LiNbO_3$, $LiTaO_3$, $KNbO_3$ or $BaTiO_3$.

6. The method of claim 5 wherein the crystallographic structure of the block is either tetragonal or rhombohedral.

7. The method of claim 1 further including applying electrodes onto surfaces of the piezoelectric element and poling the piezoelectric element to align domains in the piezoelectric element.

* * * * *